(12) United States Patent
Shi

(10) Patent No.: US 9,905,470 B2
(45) Date of Patent: Feb. 27, 2018

(54) ARRAY SUBSTRATE AND MANUFACTURING METHOD FOR THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 301 days.

(21) Appl. No.: 14/890,654

(22) PCT Filed: Oct. 21, 2015

(86) PCT No.: PCT/CN2015/092357
§ 371 (c)(1),
(2) Date: Nov. 12, 2015

(87) PCT Pub. No.: WO2017/059607
PCT Pub. Date: Apr. 13, 2017

(65) Prior Publication Data
US 2017/0186651 A1 Jun. 29, 2017

(51) Int. Cl.
*H01L 23/52* (2006.01)
*H01L 21/8234* (2006.01)
(Continued)

(52) U.S. Cl.
CPC .... *H01L 21/823462* (2013.01); *G02F 1/1333* (2013.01); *H01L 21/0272* (2013.01); *H01L 21/0331* (2013.01); *G02F 2001/1635* (2013.01)

(58) Field of Classification Search
CPC ............. H01L 27/1225; H01L 29/7869; H01L 27/3262; H01L 27/124; H01L 27/1288;
(Continued)

(56) References Cited

U.S. PATENT DOCUMENTS

| 6,683,660 | B1 | 1/2004 | Wu et al. |
| 9,356,153 | B2 | 5/2016 | Khang et al. |

(Continued)

FOREIGN PATENT DOCUMENTS

| CN | 101179085 A | 5/2008 |
| CN | 101582431 A | 11/2009 |
| CN | 103021944 A | 4/2013 |

*Primary Examiner* — Robert Bachner
(74) *Attorney, Agent, or Firm* — Andrew C. Cheng

(57) ABSTRACT

An array substrate and a manufacturing method therefor. The method comprises: patterning a first metal layer by means of a first photomask so as to form a gate electrode (21) and a first conductor (22) which are arranged at an interval; patterning a semiconductor layer (40) and a gate insulating layer (30) by means of a second photomask so as to form a through hole (23) which Is exposed out of the first conductor (22); patterning the semiconductor layer (40) by means of the gate electrode (21) and the first conductor (22) so as to form a first channel region (43) and a second channel region (44) which are arranged at an interval; and patterning a second metal layer by means of a third photomask so as to form a source electrode (51), a drain electrode (52) and a second conductor (53) which are arranged at intervals, wherein the second conductor (53) is in contact with the first conductor (22) via the through hole (23). By means of the manufacturing method for the array substrate, the semiconductor layer (40) and the gate insulating layer (30) are patterned by means of a photomask, so that the production costs of the array substrate are reduced, bridging between the first conductor (22) and the second conductor (53) is realized using a relatively simple method, and the production efficiency of the array substrate is further improved.

8 Claims, 4 Drawing Sheets

(51) Int. Cl.
  *H01L 21/033*  (2006.01)
  *H01L 21/027*  (2006.01)
  *G02F 1/1333*  (2006.01)
  *G02F 1/163*   (2006.01)

(58) Field of Classification Search
  CPC .............. H01L 29/24; H01L 29/78618; H01L 29/78648; H01L 29/4908; H01L 29/78696; H01L 27/127; H01L 2227/323; H01L 21/02565
  See application file for complete search history.

(56) References Cited

U.S. PATENT DOCUMENTS

| | | |
|---|---|---|
| 9,793,298 B2 | 10/2017 | Wang |
| 2004/0263757 A1 | 12/2004 | Kwon et al. |
| 2010/0155719 A1 | 6/2010 | Sakata et al. |

ARRAY SUBSTRATE AND MANUFACTURING METHOD FOR THE SAME

BACKGROUND OF THE INVENTION

1. Field of the Invention

The present invention relates to a liquid crystal field, and more particularly to an array substrate and a manufacturing method for the same.

2. Description of Related Art

In an Active Matrix Liquid Crystal Display (AMLCD) or an Active-matrix organic light emitting diode (AMOLED) display, a Gate Driver on Array (GOA) technology is utilized to achieve a narrow-frame effect.

Wherein, in the GOA technology, in the manufacturing process for an array substrate, two metal layers disposed separately are required. At the same time, the two metal layers have to cross a gate insulation layer of the array substrate for connecting. Therefore, how to connecting the two metal layers by a relative simple way in order to improve the production efficiency is an urgent problem need to be solved. Besides, in order to realize connecting of the two metal layers. In the manufacturing process of the array substrate, two different masks are required to respectively patterning a semiconductor layer and the gate insulation layer, which increases the manufacturing cost for the array substrate.

SUMMARY OF THE INVENTION

The main technology problem solved by the present invention is to provide: an array substrate and a manufacturing method for the same, which adopts one mask for patterning a semiconductor layer and a gate insulation layer in order to reduce the production cost of the array substrate. Besides, the present invention can realize the connecting of the two metal layers in the array substrate with a relative simple way in order to improve the production efficiency of the array substrate.

In order to solve the above technology problem, a technology solution adopted by the present invention is: a manufacturing method for an array substrate, comprising following steps: providing a substrate, depositing a first metal layer on the substrate, and patterning the first metal layer through a first mask in order to form a gate electrode and a first conductive layer which are disposed at an interval; depositing a gate insulation layer on the gate electrode and the first conductive layer; depositing a semiconductor layer on the gate insulation layer, and patterning the semiconductor layer and the gate insulation layer through a second mask in order to form a through hole for revealing the first conductive layer; patterning the semiconductor layer through the gate electrode and the first conductive layer in order to form a first channel region and a second channel region which are disposed at an interval, wherein the first channel region is correspondingly located above the gate electrode, and the second channel region is correspondingly located above the first conductive layer; and depositing a second metal layer on the first channel region and the second channel region, and patterning the second metal layer through a third mask in order to form a source electrode, a drain electrode and a second conductive layer which are disposed at intervals. Wherein, the second conductive layer is contacted with the first conductive layer through the through hole; wherein, the step of patterning the semiconductor layer and the gate insulation layer through a second mask in order to form a through hole for revealing the first conductive layer is: coating a first photoresist layer on the semiconductor layer; performing a front exposing and developing to the first photoresist layer through the second mask; wet etching the first photoresist layer, the semiconductor layer and the gate insulation layer after developing; and removing the first photoresist layer after wet etching in order to form the through hole for revealing the first conductive layer at the semiconductor layer and the gate insulation layer; wherein, the step of patterning the semiconductor layer through the gate electrode and the first conductive layer in order to form a first channel region and a second channel region is: coating a second photoresist layer on the semiconductor layer; performing back exposing and developing to the second photoresist layer through the gate electrode and the first conductive layer; wet etching the second photoresist layer and the semiconductor layer after developing; and removing the second photoresist layer after wet etching in order to form the first channel region and the second channel region in the semiconductor layer.

Wherein, the step of depositing a gate insulation layer on the gate electrode and the first conductive layer specifically is: depositing the gate insulation layer on the gate electrode and the first conductive layer through a plasma enhanced chemical vapor deposition (PECVD) method; and the step of depositing a semiconductor layer on the gate insulation layer specifically is: depositing the semiconductor layer on the gate insulation layer through a physical vapor deposition (PVD) method.

Wherein, a material of the semiconductor layer is indium gallium zinc oxide.

In order to solve the above technology problem, another technology solution adopted by the present invention is: a manufacturing method for an array substrate, comprising following steps: providing a substrate, depositing a first metal layer on the substrate, and patterning the first metal layer through a first mask in order to form a gate electrode and a first conductive layer which are disposed at an interval; depositing a gate insulation layer on the gate electrode and the first conductive layer; depositing a semiconductor layer on the gate insulation layer, and patterning the semiconductor layer and the gate insulation layer through a second mask in order to form a through hole for revealing the first conductive layer; patterning the semiconductor layer through the gate electrode and the first conductive layer in order to form a first channel region and a second channel region which are disposed at an interval, wherein the first channel region is correspondingly located above the gate electrode, and the second channel region is correspondingly located above the first conductive layer; and depositing a second metal layer on the first channel region and the second channel region, and patterning the second metal layer through a third mask in order to form a source electrode, a drain electrode and a second conductive layer which are disposed at intervals. Wherein, the second conductive layer is contacted with the first conductive layer through the through hole.

Wherein, the step of depositing a gate insulation layer on the gate electrode and the first conductive layer specifically is: depositing the gate insulation layer on the gate electrode and the first conductive layer through a plasma enhanced chemical vapor deposition (PECVD) method; and the step of depositing a semiconductor layer on the gate insulation layer specifically is: depositing the semiconductor layer on the gate insulation layer through a physical vapor deposition (PVD) method.

Wherein, the step of patterning the semiconductor layer and the gate insulation layer through a second mask in order to form a through hole for revealing the first conductive layer is: coating a first photoresist layer on the semiconductor layer; performing a front exposing and developing to the first photoresist layer through the second mask; wet etching the first photoresist layer, the semiconductor layer and the gate insulation layer after developing; and removing the first photoresist layer after wet etching in order to form the through hole for revealing the first conductive layer at the semiconductor layer and the gate insulation layer.

Wherein, the step of patterning the semiconductor layer through the gate electrode and the first conductive layer in order to form a first channel region and a second channel region is: coating a second photoresist layer on the semiconductor layer; performing back exposing and developing to the second photoresist layer through the gate electrode and the first conductive layer; wet etching the second photoresist layer and the semiconductor layer after developing; and removing the second photoresist layer after wet etching in order to form the first channel region and the second channel region in the semiconductor layer.

Wherein, a material of the semiconductor layer is indium gallium zinc oxide.

In order to solve the above technology problem, another technology solution adopted by the present invention is: an array substrate, comprising: a substrate, a first metal layer, a gate insulation layer, a semiconductor layer and a second metal layer sequentially disposed from bottom to top; wherein, the first metal layer includes a gate electrode and a first conductive layer which are disposed at an interval; the semiconductor layer includes a first channel region and a second channel region which are disposed at an interval; the second metal layer includes a source electrode, a drain electrode and a second conductive layer which are disposed at intervals; wherein, the first channel region is correspondingly located above the gate electrode, and the second channel region is correspondingly located above the first conductive layer; wherein, the source electrode and the drain electrode are contacted with the first channel region, the second conductive layer is contacted with the second channel region and also contacted with the first conductive layer through a through hole; and wherein, the gate insulation layer and the semiconductor layer are patterned through one mask.

Wherein, the second channel region includes a first channel portion and a second channel portion, the first channel portion and the second channel portion are disposed at two sides of the through hole, wherein, the second conductive layer covers the first channel portion, the through hole and the second channel portion.

Wherein, a material of the first metal layer and the second metal layer is copper, aluminum or molybdenum.

Wherein, a material of the gate insulation layer is silicon oxide or silicon nitride.

Wherein, a material of the semiconductor layer is indium gallium zinc oxide.

The beneficial effect of the present invention is: in the array substrate and the manufacturing method of the present, through patterning the first metal layer through a first mask to form a gate electrode and a first conductive layer which are disposed at an interval; patterning the semiconductor layer and the gate insulation layer through a second mask to form a through hole for revealing the first conductive layer; patterning the semiconductor layer through the gate electrode and the first conductive layer to form a first channel region and a second channel region which are disposed at an interval; patterning the second metal layer through a third mask to form a source electrode, a drain electrode and a second conductive layer which are disposed at intervals; wherein, the second conductive layer is contacted with the first conductive layer through the through hole. Through above way, the gate insulation layer and the semiconductor layer are patterned through one mask to reduce the production cost. Besides, the present invention realize the connecting of the first conductive layer and the second conductive layer by a relative simple way so as to improve the production efficiency of the array substrate.

DETAILED DESCRIPTION OF THE PREFERRED EMBODIMENT

In the embodiment and claims of the present invention, some vocabularies are used to indicate some specific elements. A person skilled in the art can understand that manufacturers may use a different vocabulary to indicate a same element. The present embodiment and claims do not use the difference in the vocabularies to distinguish the elements. The present embodiment and claims utilize the difference in the functions of the elements to distinguish the elements. The following content combines with the drawings and the embodiment for describing the present invention in detail.

Figure 1:
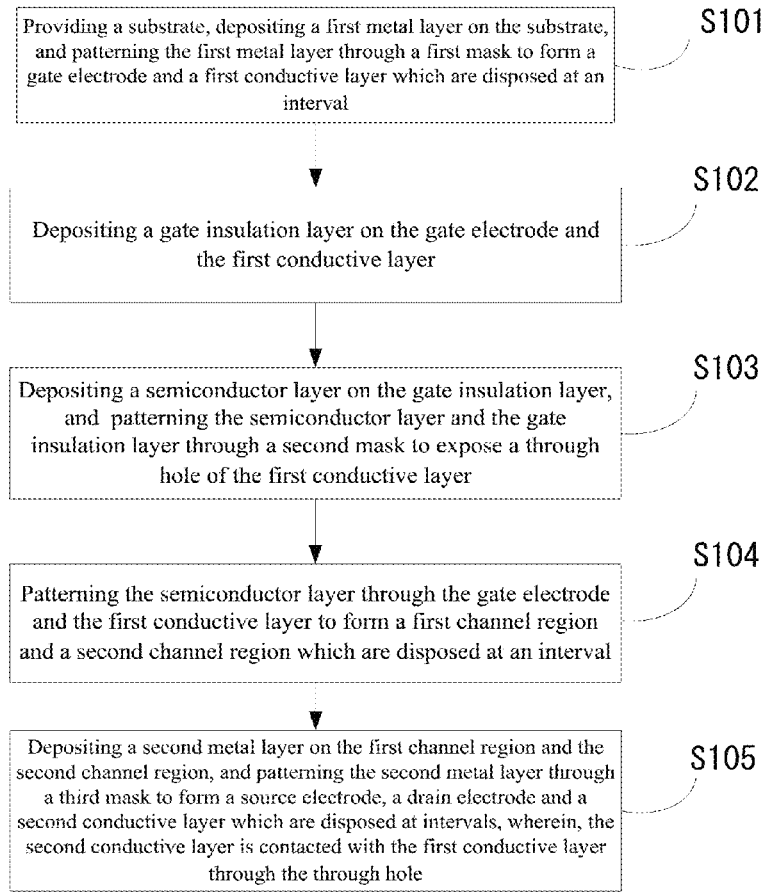
FIG. 1 is a flowchart of a manufacturing method for an array substrate according to an embodiment of the present invention.

FIG. 1 is a flowchart of a manufacturing method for an array substrate according to an embodiment of the present invention; FIG. 2A-2G is a schematic structure diagram for an array substrate in the manufacturing process of the manufacturing method shown in FIG. 1. It should be noted that if there exists a substantially same result, the method of the present invention is not limited to the flowchart shown in FIG. 1. As shown in FIG. 1, the method includes following steps:

Step S101: providing a substrate, depositing a first metal layer on the substrate, and patterning the first metal layer through a first mask in order to form a gate electrode and a first conductive layer which are disposed at an interval.

In the step S101, the substrate is preferably a glass substrate, a material of the first metal layer is copper, aluminum or molybdenum.

Figure 2A:
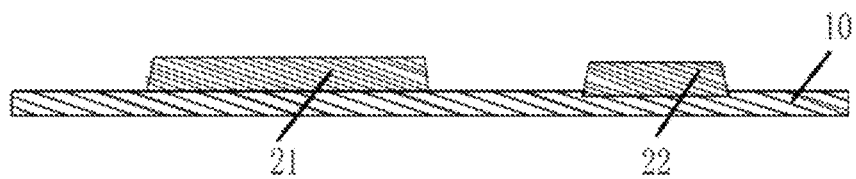
FIG. 2A-2G is a schematic structure diagram for an array substrate in the manufacturing process of the manufacturing method shown in FIG. 1.

With combined reference to FIG. 2A, FIG. 2A is a cross-sectional view of a gate electrode 21 and a first conductive layer 22 after using a first mask for patterning the first metal layer deposited on the substrate 10.

Step S102: depositing a gate insulation layer on the gate electrode and the first conductive layer.

In the step S102, the step of depositing a gate insulation layer on the gate electrode and the first conductive layer specifically is: depositing the gate insulation layer on the gate electrode and the first conductive layer through a plasma enhanced chemical vapor deposition (PECVD) method. Preferably, a material of the gate insulation layer is silicon oxide or silicon nitride.

Step S103: depositing a semiconductor layer on the gate insulation layer, and patterning the semiconductor layer and the gate insulation layer through a second mask in order to form a through hole for revealing the first conductive layer.

In the step S103, the step of depositing a semiconductor layer on the gate insulation layer specifically is: depositing the semiconductor layer on the gate insulation layer through a physical vapor deposition (PVD) method. Preferably, a material of the semiconductor layer is indium gallium zinc oxide (IGZO).

Wherein, the step of patterning the semiconductor layer and the gate insulation layer through a second mask in order to form a through hole for revealing the first conductive layer specifically is: coating a first photoresist layer on the semiconductor layer; performing a front exposing and developing to the first photoresist layer through the second mask; wet etching the first photoresist layer, the semiconductor layer and the gate insulation layer after developing; removing the first photoresist layer after wet etching in order to form the through hole for revealing the first conductive layer at the semiconductor layer and the gate insulation layer.

Figure 2B:
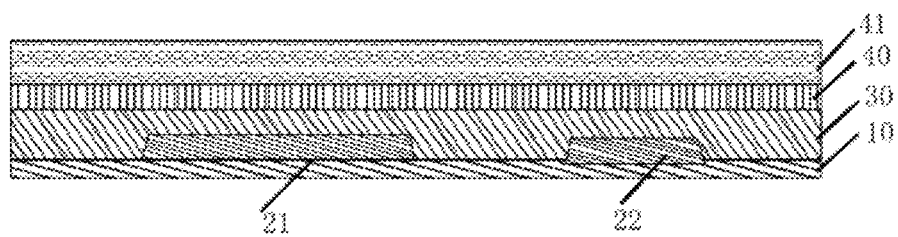
Figure 2C:
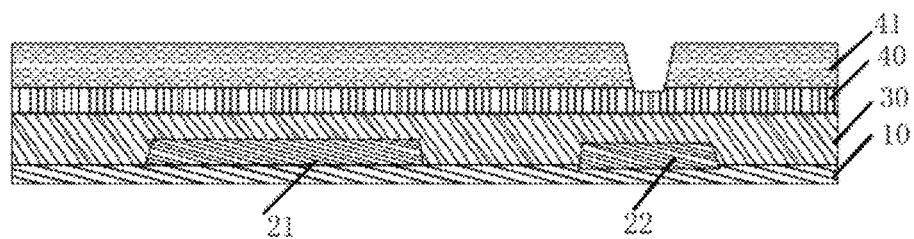
Figure 2D:
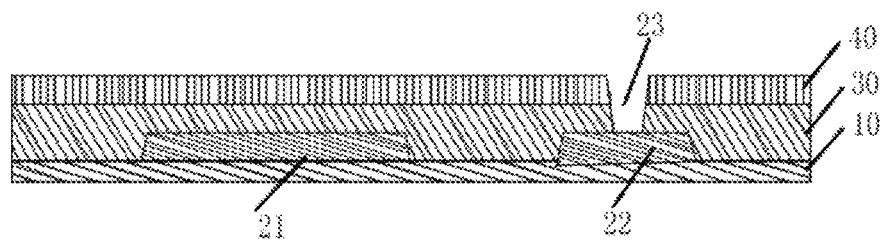

With combined reference to FIG. 2B, FIG. 2C and FIG. 2D. Wherein, FIG. 2B shows a cross-sectional view of the substrate 10, the gate electrode 21, the first conductive layer 22, the gate insulation layer 30 and the semiconductor layer 40 coating with a first photoresist layer 41. FIG. 2C shows a cross-sectional view of the substrate 10, the gate electrode 21, the first conductive layer 22, the gate insulation layer 30, the semiconductor layer 40 and the first photoresist layer 41 after front exposing and developing the first photoresist layer 41. FIG. 2D shows a cross-sectional view of the substrate 10, the gate electrode 21, the first conductive layer 22, the gate insulation layer 30, the semiconductor layer 40 and the through hole 23 for revealing the first conductive layer 22 after wet etching the first photoresist layer 41.

Step S104: patterning the semiconductor layer through the gate electrode and the first conductive layer in order to form a first channel region and a second channel region which are disposed at an interval.

In the step S104, the step of patterning the semiconductor layer through the gate electrode and the first conductive layer in order to form a first channel region and a second channel region which are disposed at an interval is: coating a second photoresist layer on the semiconductor layer; performing back exposing and developing to the second photoresist layer through the gate electrode and the first conductive layer; wet etching the second photoresist layer and the semiconductor layer after developing; removing the second photoresist layer after wet etching in order to form the first channel region and the second channel region in the semiconductor layer. The person skilled in the art can understand that in the step S104, using the gate electrode and the first conductive layer as a mask can reduce the number of the masks used in the manufacturing process of the array substrate, and the manufacturing cost of the array substrate.

Figure 2E:
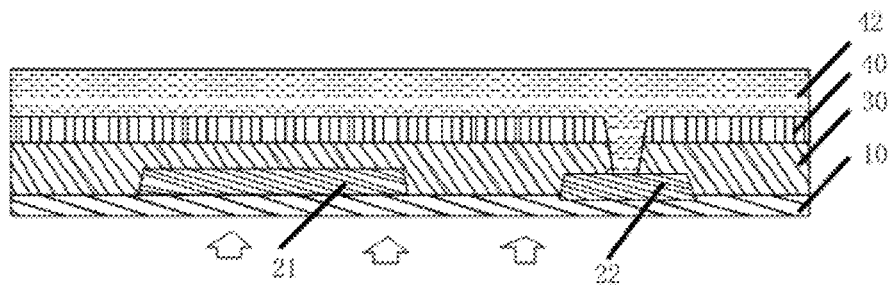
Figure 2F:
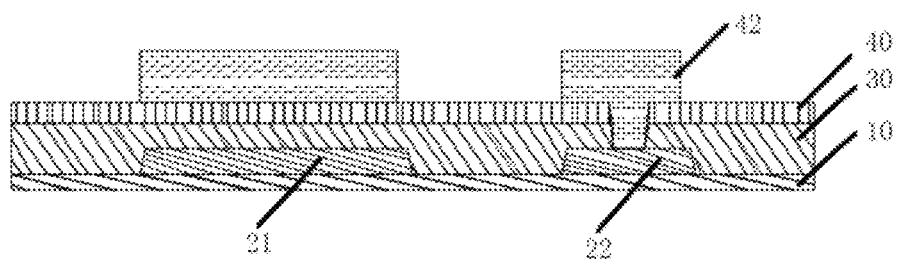
Figure 2G:
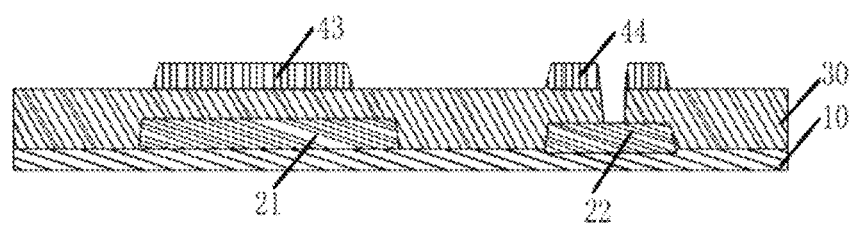

Wherein, the first channel region is located above the gate electrode, and the second channel region is located above the first conductive layer. With reference to FIG. 2E, FIG. 2F and FIG. 2G. Wherein, FIG. 2E shows a cross-sectional view of the substrate 10, the gate electrode 21, the first conductive layer 22, the gate insulation layer 30 and the semiconductor layer 40 coating with the second photoresist layer 42. FIG. 2F shows a cross-sectional view of the substrate 10, the gate electrode 21, the first conductive layer 22, the gate insulation layer 30, the semiconductor layer 40 and the second photoresist layer 42 after back exposing the second photoresist layer 42 through the gate electrode and the first conductive layer and after developing. FIG. 2G shows a cross-sectional view of the substrate 10, the gate electrode 21, the first conductive layer 22, the gate insulation layer 30, the first channel region 43 and the second channel region 44 removing the second photoresist layer 42 and after wet etching.

Step S105, depositing a second metal layer on the first channel region and the second channel region, and patterning the second metal layer through a third mask in order to form a source electrode, a drain electrode and a second conductive layer which are disposed at intervals. Wherein, the second conductive layer is contacted with the first conductive layer through the through hole.

In the step S105, the step of depositing a second metal layer on the first channel region and the second channel region specifically is: depositing the second metal layer on the first channel region and the second channel region through a physical vapor deposition method. Preferably, a material of the second metal layer is copper, aluminum or molybdenum.

In the present embodiment, the material of the first metal layer and the material of the second metal layer are different. In another embodiment, the material of the first metal layer and the material of the second metal layer may be the same.

In the present embodiment, the source electrode and the drain electrode are contacted with the first channel region, and the second conductive layer is contacted with the second channel region. In another embodiment, it can only reserve the first channel region, and the second conductive layer is directly contacted with the first conductive layer through the through hole.

Figure 3:
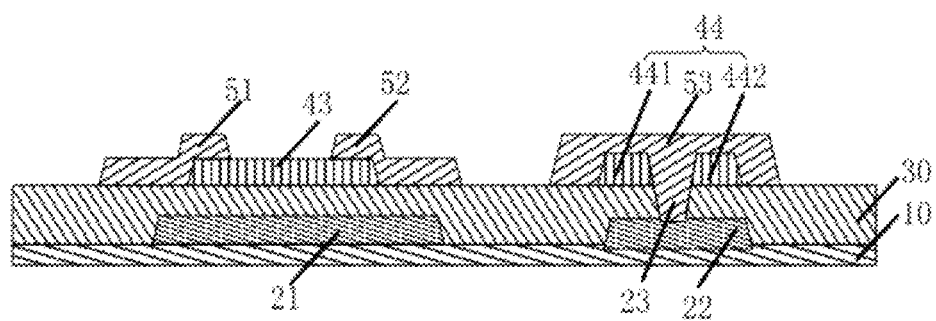
FIG. 3 is a schematic structure diagram of the array substrate manufactured by the manufacturing method shown in FIG. 1.

With also reference to FIG. 3, FIG. 3 is a schematic structure diagram of the array substrate manufactured by the manufacturing method shown in FIG. 1. As shown in FIG. 3, the array substrate includes the substrate 10, the first metal layer, the gate insulation layer 30, the semiconductor layer and the second metal layer sequentially disposed from bottom to top.

Wherein, the first metal layer includes the gate electrode 21 and the first conductive layer 22 which are disposed at an interval. The semiconductor layer includes the first channel region 43 and the second channel region 44 which are disposed at an interval. The second metal layer includes the source electrode 51, the drain electrode 52 and the second conductive layer 53 which are disposed at intervals.

Wherein, the first channel region 43 is correspondingly located above the gate electrode 21, and the second channel region 44 is correspondingly located above the first conductive layer 22. The source electrode 51 and the drain electrode 52 are contacted with the first channel region 43. The second conductive layer 53 is contacted with the second channel region 44 and also contacted with the first conductive layer 22 through the through hole.

Wherein, the through hole 23 is manufactured by patterning the gate insulation layer 30 and the semiconductor layer through a mask.

Wherein, the gate insulation layer 30 and the semiconductor layer are patterned through a mask.

Preferably, the second channel region 44 includes a first channel portion 441 and a second channel portion 442. The first channel portion 441 and the second channel portion 442 are disposed at two sides of the through hole 23. The second conductive layer 53 covers the first channel portion 441, the through hole 23 and the second channel portion 442.

Preferably, the material of the gate electrode 21 and the first conductive layer 22 which are located at the first metal layer, and the material of the source electrode 51, the drain electrode 52 and the second conductive layer 53 which are located at the second metal layer are copper, aluminum or molybdenum.

Preferably, a material of the gate insulation layer 30 is silicon oxide or silicon nitride.

Preferably, a material of the first channel region 43 and the second channel region 44 which are located at the semiconductor layer is indium gallium zinc oxide.

The beneficial effect of the present invention is: in the array substrate and the manufacturing method of the present, through patterning the first metal layer through a first mask to form a gate electrode and a first conductive layer which are disposed at an interval; patterning the semiconductor layer and the gate insulation layer through a second mask to form a through hole for revealing the first conductive layer; patterning the semiconductor layer through the gate electrode and the first conductive layer to form a first channel region and a second channel region which are disposed at an interval; patterning the second metal layer through a third mask to form a source electrode, a drain electrode and a second conductive layer which are disposed at intervals; wherein, the second conductive layer is contacted with the first conductive layer through the through hole. Through above way, the gate insulation layer and the semiconductor layer are patterned through one mask to reduce the production cost. Besides, the present invention realize the connecting of the first conductive layer and the second conductive layer by a relative simple way so as to improve the production efficiency of the array substrate.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an array substrate, comprising following steps:
   providing a substrate, depositing a first metal layer on the substrate, and patterning the first metal layer through a first mask in order to form a gate electrode and a first conductive layer which are disposed at an interval;
   depositing a gate insulation layer on the gate electrode and the first conductive layer;
   depositing a semiconductor layer on the gate insulation layer, and patterning the semiconductor layer and the gate insulation layer through a second mask in order to form a through hole for revealing the first conductive layer;
   patterning the semiconductor layer through the gate electrode and the first conductive layer in order to form a first channel region and a second channel region which are disposed at an interval, wherein the first channel region is correspondingly located above the gate electrode, and the second channel region is correspondingly located above the first conductive layer; and
   depositing a second metal layer on the first channel region and the second channel region, and patterning the second metal layer through a third mask in order to form a source electrode, a drain electrode and a second conductive layer which are disposed at intervals, wherein, the second conductive layer is contacted with the first conductive layer through the through hole;
   wherein, the step of patterning the semiconductor layer and the gate insulation layer through a second mask in order to form a through hole for revealing the first conductive layer is:
   coating a first photoresist layer on the semiconductor layer;
   performing a front exposing and developing to the first photoresist layer through the second mask;
   wet etching the first photoresist layer, the semiconductor layer and the gate insulation layer after developing; and
   removing the first photoresist layer after wet etching in order to form the through hole for revealing the first conductive layer at the semiconductor layer and the gate insulation layer;
   wherein, the step of patterning the semiconductor layer through the gate electrode and the first conductive layer in order to form a first channel region and a second channel region is:
   coating a second photoresist layer on the semiconductor layer;
   performing back exposing and developing to the second photoresist layer through the gate electrode and the first conductive layer;
   wet etching the second photoresist layer and the semiconductor layer after developing; and
   removing the second photoresist layer after wet etching in order to form the first channel region and the second channel region in the semiconductor layer.

2. The manufacturing method according to claim 1, wherein,
   the step of depositing a gate insulation layer on the gate electrode and the first conductive layer specifically is: depositing the gate insulation layer on the gate electrode and the first conductive layer through a plasma enhanced chemical vapor deposition (PECVD) method; and
   the step of depositing a semiconductor layer on the gate insulation layer specifically is: depositing the semiconductor layer on the gate insulation layer through a physical vapor deposition (PVD) method.

3. The manufacturing method according to claim 1, wherein, a material of the semiconductor layer is indium gallium zinc oxide.

4. A manufacturing method for an array substrate, comprising following steps:
   providing a substrate, depositing a first metal layer on the substrate, and patterning the first metal layer through a first mask in order to form a gate electrode and a first conductive layer which are disposed at an interval;
   depositing a gate insulation layer on the gate electrode and the first conductive layer;
   depositing a semiconductor layer on the gate insulation layer, and patterning the semiconductor layer and the gate insulation layer through a second mask in order to form a through hole for revealing the first conductive layer;
   patterning the semiconductor layer through the gate electrode and the first conductive layer in order to form a first channel region and a second channel region which are disposed at an interval, wherein the first channel region is correspondingly located above the gate electrode, and the second channel region is correspondingly located above the first conductive layer; and
   depositing a second metal layer on the first channel region and the second channel region, and patterning the second metal layer through a third mask in order to form a source electrode, a drain electrode and a second conductive layer which are disposed at intervals, wherein, the second conductive layer is contacted with the first conductive layer through the through hole.

5. The manufacturing method according to claim 4, wherein, the step of depositing a gate insulation layer on the gate electrode and the first conductive layer specifically is: depositing the gate insulation layer on the gate electrode and the first conductive layer through a plasma enhanced chemical vapor deposition (PECVD) method; and the step of depositing a semiconductor layer on the gate insulation layer specifically is: depositing the semiconductor layer on the gate insulation layer through a physical vapor deposition (PVD) method.

6. The manufacturing method according to claim 4, wherein, the step of patterning the semiconductor layer and the gate insulation layer through a second mask in order to form a through hole for revealing the first conductive layer is:

coating a first photoresist layer on the semiconductor layer;

performing a front exposing and developing to the first photoresist layer through the second mask;

wet etching the first photoresist layer, the semiconductor layer and the gate insulation layer after developing; and removing the first photoresist layer after wet etching in order to form the through hole for revealing the first conductive layer at the semiconductor layer and the gate insulation layer.

7. The manufacturing method according to claim 4, wherein, the step of patterning the semiconductor layer through the gate electrode and the first conductive layer in order to form a first channel region and a second channel region is:

coating a second photoresist layer on the semiconductor layer;

performing back exposing and developing to the second photoresist layer through the gate electrode and the first conductive layer;

wet etching the second photoresist layer and the semiconductor layer after developing; and removing the second photoresist layer after wet etching in order to form the first channel region and the second channel region in the semiconductor layer.

8. The manufacturing method according to claim 4, wherein, a material of the semiconductor layer is indium gallium zinc oxide.

* * * * *